United States Patent [19]

Fujimori et al.

[11] Patent Number: 5,280,201
[45] Date of Patent: Jan. 18, 1994

[54] SEMICONDUCTOR LOGIC CIRCUIT APPARATUS

[75] Inventors: Kumiko Fujimori; Hirofumi Shinohara; Noriaki Matsumoto; Shuichi Kato, all of Itami, Japan

[73] Assignee: Mitsubishi Denki Kabushiki Kaisha, Tokyo, Japan

[21] Appl. No.: 760,997

[22] Filed: Sep. 17, 1991

[30] Foreign Application Priority Data

Sep. 20, 1990 [JP] Japan .................................. 2-253137

[51] Int. Cl.⁵ ........................ H03K 19/20; H03K 5/159
[52] U.S. Cl. ................................. 307/448; 307/451; 307/352
[58] Field of Search ............... 307/448, 451, 452, 453, 307/352, 353, 585

[56] References Cited

U.S. PATENT DOCUMENTS 4,554,467 11/1985 Vaughn ........................ 307/585
4,577,124 3/1986 Koike ........................... 307/448
4,733,111 3/1988 Fassino et al. ................. 307/585

FOREIGN PATENT DOCUMENTS 279297 3/1990 Japan .

OTHER PUBLICATIONS

J. Millman, Integrated Electronics:Analog and Digital Circuits and Systems, pp. 625-5 (1972).

Primary Examiner—Edward P. Westin
Assistant Examiner—Andrew Sanders
Attorney, Agent, or Firm—Thomas R. Morrison

[57] ABSTRACT

A semiconductor logic circuit apparatus which include a first switching element consisting of a field effect transistor for changing holding data, an inverter circuit whose input is connected with one end of the first switching element, a feedback circuit whose input and output are connected with the output and input of the inverter circuit, and a second switching element connected between the output of the feedback circuit and first or second potential. The second switching element is effective for enabling and disabling the feedback circuit.

The first and second switching elements are opened/closed in reverse phase to each other. Feedback of the feedback circuit is prevented until the inverter circuit is driven from its "0" to its "1" holding state, so that driving of the inverter circuit becomes easy and operational stability and operating speed are enhanced.

3 Claims, 10 Drawing Sheets

SEMICONDUCTOR LOGIC CIRCUIT APPARATUS

BACKGROUND OF THE INVENTION

1. Field of the Invention

The present invention relates to a semiconductor logic circuit apparatus, especially to a semiconductor logic circuit apparatus which is capable of holding past input data and of changing the held data according to a switching means.

2. Description of Related Art

FIG. 1 is a circuit diagram showing one construction example of a conventional semiconductor logic circuit apparatus (in the following, to be called a logic circuit apparatus) which is capable of holding past input data and of changing the held data according to a switching means, especially an example in which, as shown, a ratio latch circuit is constructed.

In FIG. 1, the logic circuit apparatus is provided with inverter circuits 1a and 1b, especially the inverter circuit 1b comprising a P-type field effect transistor (hereinafter to be called FET) 1c and an N-type FET 1d. The input terminal of the inverter 1a and the output terminal of the inverter 1b are connected to a node 2a, and the input terminal of the inverter 1b and the output terminal of the inverter 1a are connected to a node 2b. One end of an N-type FET 3 is connected to the node 2a and the other end thereof is connected to a data input terminal 5. A gate of the FET 3 receives control signal through a control terminal 6. The node 2b is also connected to a data output terminal 7.

Next, explanation will be given on the operation of the conventional logic circuit apparatus shown in FIG. 1.

Referring to FIG. 1, explanation will be given, at first, on the operation, for example, of the time when the logic circuit apparatus changes its state from a "0" holding state to a "1" holding state. In this case, a control signal "1" is applied to the gate of the FET 3, the FET 3 becomes conductive, so that the data input terminal 5 and node 2a are electrically connected. The signal at the node 2a is initially "0". The value of input data input from the input terminal 5 is "1", the value at the node 2b is initially "1" and the FET 1d is on until the output of the inverter 1a is changed. Therefore, corresponding to ratio of the FET 3 and FET 1d, the electric potential of the node 2a rises. But, since the FET 3 is N-type and FET 1d is on an electric potential is applied to the input of inverter 1a that is lower that the source potential at input terminal 5 by the threshold Vth of the FET 3. When the electric potential at the node 2a rises until it exceeds the logical threshold of the inverter 1a, the output of the inverter 1a changes to "0", the FET 1a is turned off, and the FET 1c is turned on. As a result, the electric potential of the node 2a rises until it reaches the source potential. After that, when the control signal changes from "1" to "0" and the FET 3 becomes non-conductive, the nodes 2a and 2b hold respective values in the state existing immediately before the change of the control signal at the gate of the FET 3. The data output terminal 7 continues to output the value of the node 2b until the FET 3 is again made conductive.

Next, FIG. 2 is a circuit diagram showing another example of the conventional logic circuit apparatus, especially an example of a ratioless latch circuit.

As shown in FIG. 2, an input terminal of an inverter 1a, one end of an N-type FET 3a and one end of a P-type FET 3b are connected to a node 2a. An input terminal of an inverter 1b and the output terminal of the inverter 1a are connected to a node 2b. The other end of the P-type FET 3b and the output terminal of the inverter 1b are connected to each other. The other end of an N-type FET 3 is connected to a data input terminal 5. A control signal is applied to the gates of the FETs 3a and 3b through a control terminal 6. The node 2b is connected to a data output terminal 7.

Referring to FIG. 2, explanation will be given of operation, for example, at a time when the logic circuit apparatus changes from a "0" holding state to a "1" holding state.

In this case, when control signal "1" is applied to the gates of FETs 3a and 3b, the FET 3a becomes conductive and 3b becomes non-conductive. The data input terminal 5 is electrically connected to the node 2a. The node 2a is electrically disconnected from the output of the inverter 1b. Initially the signal at the node 2a is "0". The new signal of "1" is input to the node 2a from the data input terminal 5. The electric potential of the node 2a rises. Since the FET 3a is N-type, the electric potential at the node 2a only rises to a value lower than the source potential by the threshold Vth of the FET 3a. Even when the electric potential of the node 2a exceeds the logical threshold of the inverter 1a, since the FET 3b is non-conductive as above mentioned, the electric potential of the node 2a does not exceed the value which is lower than the source potential by the threshold Vth of the FET 3a. When control signal changes from "1" to "0", the FET 3a becomes non-conductive and 3b conductive. The nodes 2a and 2b hold their respective values in the state just before the change of the control signal, and the data output terminal 7 continues to output the value of the node 2b until the FET 3 again becomes conductive.

Next, FIG. 3 is a circuit diagram showing another example of a conventional logic circuit apparatus, especially an example of a ratio latch circuit.

The difference between the circuit shown in FIG. 3 from the one shown in FIG. 1 is that ends of an N-type FET 3a are connected respectively with ends of a P-type FET 3b. Complementary signals are connected to the gates of FETs 3a and 3b from control terminals 6a and 6b respectively.

Referring to FIG. 3, explanation will be given of operation when the logic circuit apparatus changes its state from, for example, a "0" holding state to a "1" holding state.

When control signals "1" and "0" are applied to control signal input terminals 6a and 6b respectively of FET 3a and 3b, FETs 3a, 3b become conductive, and the data input terminal 5 is electrically connected to the node 2a. This operation is the same as that of the logic circuit apparatus shown in FIG. 1. Although the FET 1d is on until the output of the inverter 1a changes state, the electric potential of the node 2a rises to a value little lower than the source potential since the FET 3b is P-type. When the electric potential of the node 2a exceeds the logical threshold of the inverter 1a, the output of inverter 1a changes to "0". The FET 1d is turned off and the FET 1c is turned on. The resulting condition is the same as the logic circuit apparatus in FIG. 1. That is, the electric potential of the node 2a rises to the source potential. Also operation when the control signal changes from "1" to "0" is the same as the circuit shown in FIG. 1.

Next, FIG. 4 is a circuit diagram showing a further example of a conventional logic circuit apparatus, especially an example of a ratioless latch circuit.

The difference between the logic circuit apparatus shown in FIG. 4 and the one shown in FIG. 2 is that ends of an N-type FET 3a and ends of a P-type FET 3c are connected respectively to each other. Also, ends of a P-type FET 3b and an N-type FET 3d are connected to each other. A control signal from the control terminal 6a is connected in common to the gates of the FETs 3a and 3b. The control signal from the control terminal 6b is connected in common to the gates of the FETs 3c and 3d. The signal from the control terminal 6a is complimentary to that from 6b.

Referring to FIG. 4, explanation will be given of the operation at a time, for example, when the logic circuit apparatus changes its state from a "0" holding state to a "1" holding state.

When the control signal "1" is applied to the FETs 3a and 3b from the control signal input terminal 6a and the control signal "0" is applied to the FETs 3c and 3d from the control signal input terminal 6b, the FETs 3a and 3c become conductive, and FETs 3b and 3d become non-conductive. While the data input terminal 5 is electrically connected to the node 2a, the node 2a is disconnected from the output of the inverter 1b. The operation is the same as that of the logic circuit apparatus shown in FIG. 2. Since the FETs 3b and 3d are non-conductive and the FET 3b is P-type, the electric potential of the node 2a rises to the source potential. Also the operation when the control signal is changed from "0" to "1" is the same as that shown in FIG. 2.

Conventional semiconductor logic circuit apparatus constructed as above have exhibited the following problems.

In the case of FIG. 1, a change of state from a "0" holding state to a "1" holding state cannot be carried out normally when the source potential is low. That is to say, when the FET 3 becomes conductive by receiving the control signal "1", the electric potential at the node 2a rises according to the ratio of the FET 3 and the FET 1d as above-mentioned. The FET 1d remains on until the output inverter 1a changes from "1" to "0". Here, the electric potential of the node 2a only rises to a value which is lower than the source potential by the threshold voltage Vth because the FET 3 is N-type and the FET 1d is on. Since the source potential dependency of the electric potential of the node 2a is larger than that of logical threshold of the inverter 1a, the electric potential at the node 2a cannot exceed the logical threshold of the inverter 1a when the source potential is low, thereby the inverter 1a cannot operate to produce a "0" output.

In the case of the embodiment of FIG. 2, when the logic circuit apparatus changes its state from "0" holding state to "1" holding state, or when the "0" holding state is prolonged, a feed-through current passes through the inverter 1a. That is to say, when a "1" control signal is applied to the FETs 3a and 3b, the FET 3a becomes conductive and the FET 3b becomes non-conductive. The electric potential of the node 2a rises. Since the FET 3a is N-type and the FET 3b is off, the electric potential at the node 2a only rises to a value which is lower than the source potential by the threshold voltage Vth of the FET 3a. Accordingly, while the node 2a changes its value from "0" to "1", DC feed-through current flows through the inverter 1a. When a "0" holding state is prolonged, the FET 3b becomes non-conductive to permit the electric potential of the node 2a to float easily from the ground potential of the node 2a. As a result, the electric potential of the node 2a rises to the absolute value of the threshold of the FET 3b, that is, $|Vth|$ electric potential, there being the possibility that feed-through current flows through the inverter 1a until the FET 3b becomes conductive.

Next, referring to FIG. 3, explanation will be given on the operation of the time when, for example, the logic circuit apparatus changes its state from a "0" holding state to a "1" holding state. Although the FET 1d is on until the output inverter 1a changes from "0" to "1", the electric potential at the node 2a rises to a value which is a little lower than the source potential since the FET 3b is P-type. Therefore, compared with the example shown in FIG. 1, the inverter 1a is more easily driven. But the FETs 3a and 3b require two kinds of control signals. Moreover, when this first switching means is constructed as part of a group of switching means, the larger the group, the more the number of switching elements increases.

The logic circuit apparatus shown in FIG. 4 has more stability in operation than the ones respectively shown in FIG. 1, FIG. 2 and FIG. 3. However, its use of two, the FETs 3a and 3c two switching means FETs 3b and 3d as CMOS circuits, still requires two kinds of control signals. In addition, when the first switching means consists of a group of switching means, the larger the number thereof, the more the number of the switching elements increases.

OBJECTS AND SUMMARY OF THE INVENTION

The object of the invention is to provide a semiconductor logic circuit apparatus which enables improving the operational stability and operating speed compared to the prior art.

It is the further object of the invention to provide a semiconductor logic circuit apparatus which enables reducing the consumption of current, while reducing the numbers of elements and control signals.

The semiconductor logic circuit apparatus related to the invention comprises means for supplying a first source potential, means for supplying a second source potential, first switching means which consists of a certain conductive type field effect transistors, for charging holding data, means for supplying a control signal to the first switching means, an inverter circuit having input connected with one end of the first switching means, feedback circuit disposed between the means for supplying the first and second source potentials and having the input and output respectively connected with the output and input of the inverter circuit, means for supplying data input to the other end of the first switching means, means for taking a data output from the output of the inverter circuit, and second switching means disposed between the output of the feedback circuit and the means for supplying the first or the second source potential according to the conductive type of the field effect transistors, for switching enable/disable of the feedback circuit. These first and second switching means are opened/closed in reverse phase with each other.

According to another aspect of the invention, the semiconductor logic circuit apparatus comprises means for supplying a first source potential, means for supplying a second source potential, a group of first switching means consisting of a plurality of same conductive type field effect transistors whose respective one ends are commonly connected, for changing holding data, means for supplying control signal to the group of first switching means, an inverter circuit, whose input is connected with commonly connected one ends of the group of the first switching means, a feedback circuit, disposed between the means for supplying the first and second source potentials and having input and output respectively connected with the output and input of the inverter circuit, means for supplying data input to respective other ends of the group of the first switching means, means for taking data output from the output of the inverter circuit, and a second switching means disposed between the output of the feedback circuit and the means for supplying the first and second source potentials according to a certain conductive type of the field effect transistors, for switching enable/disable of the feedback circuit. The group of the first switching means and the second switching means are so opened/-closed that the group of the whole first switching means may be in off-state when the second switching means is in on-state, and only one switching means among the group of the first switching means may be in on-state and all the rest of them are in off-state.

When the semiconductor logic circuit apparatus changes its state from a "0" holding state to a "1" holding state, data feedback from the feedback circuit is prevented until the output of the inverter circuit changes state by providing the second switching means, thereby the inverter circuit can be easily driven. When the inverter circuit is driven, the feedback circuit becomes effective by switching the second switching means, which enables the input potential of the inverter circuit to rise to the source potential.

The above and further objects and features of the invention will more fully be apparent from the following detailed description with accompanying drawings.

DESCRIPTION OF THE PREFERRED EMBODIMENTS

In the following, the present invention will be described referring to drawings showing the embodiments thereof.

Figure 1:
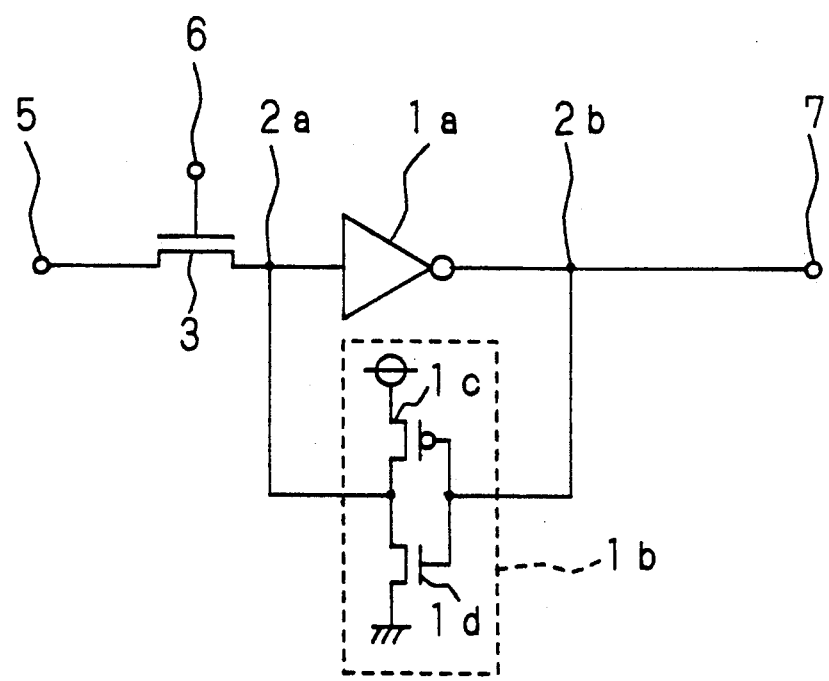
FIG. 1 is a circuit diagram showing a first example of a conventional semiconductor logic circuit apparatus.
Figure 2:
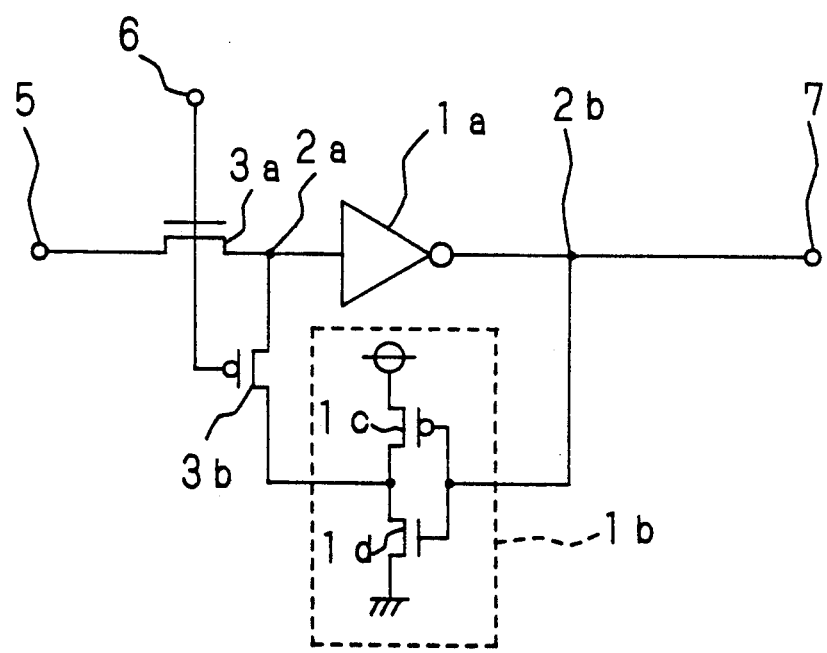
FIG. 2 is a circuit diagram showing a second example of a conventional semiconductor logic circuit apparatus.
Figure 3:
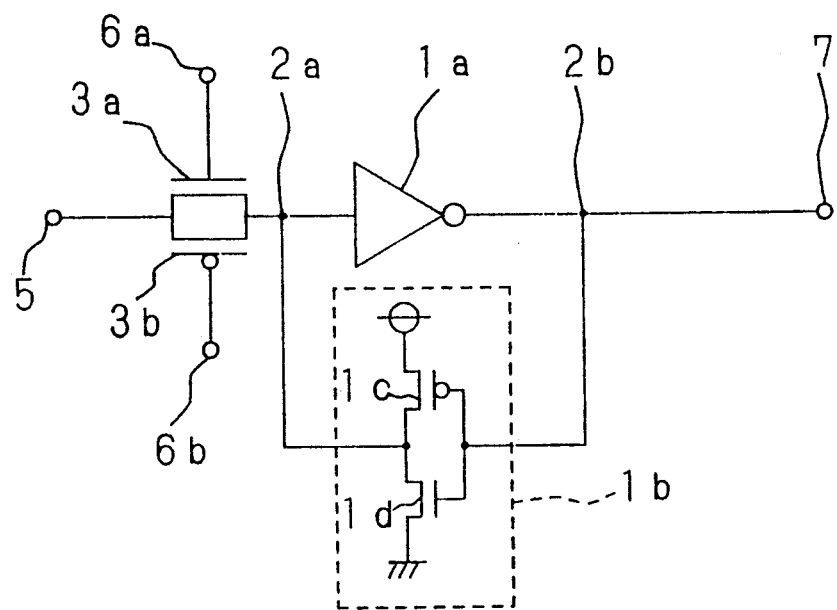
FIG. 3 is a circuit diagram showing a third example of a conventional semiconductor logic circuit apparatus.
Figure 4:
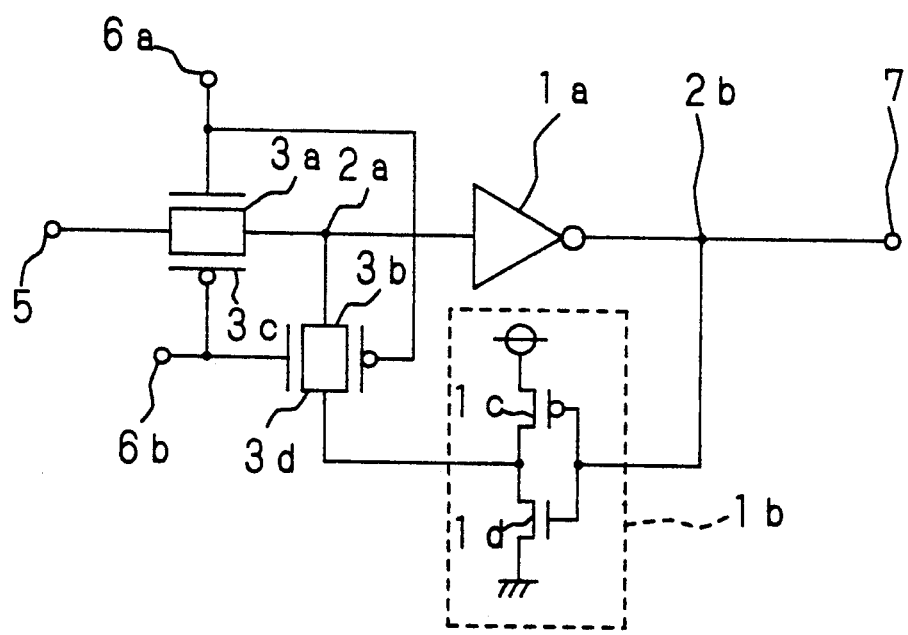
FIG. 4 is a circuit diagram showing a fourth example of a conventional semiconductor logic circuit apparatus.
Figure 5:
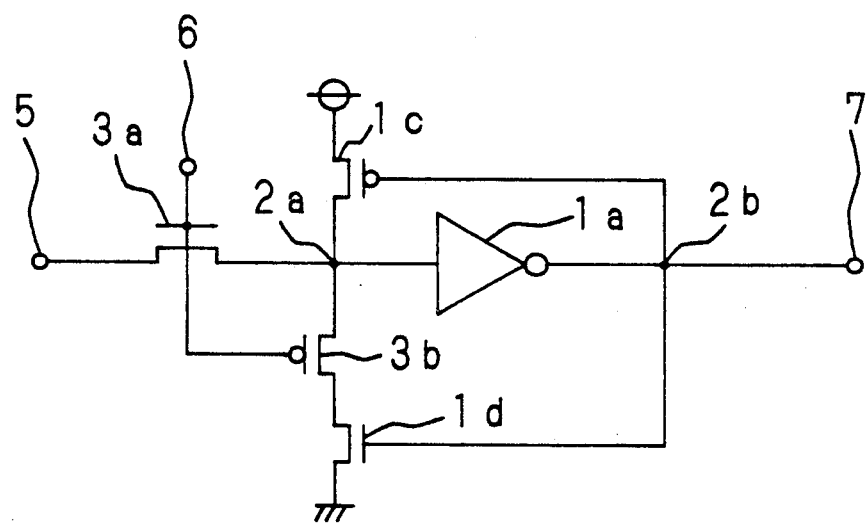
FIG. 5 is a circuit diagram showing a semiconductor logic circuit apparatus according to a first embodiment of the invention.

FIG. 5 is a circuit diagram showing a first example of a semiconductor logic circuit apparatus to the invention.

Referring to FIG. 5, an input terminal of an inverter circuit 1a, one end of an N-type field effect transistor (hereinafter, to be called FET) 3a, one end of a P-type FET 3b, and one end of a P-type FET 1c are connected to a node 2a. An output terminal of the inverter 1a is connected to a node 2b. The other end of FET 1c is connected to a source potential. The other end of the FET 3b is connected to one end of an FET 1d. The other end of the FET 1d is connected to ground. The other end of the N-type FET 3a is connected to a data input terminal 5. A control signal is connected in common to the gates of the FETs 3a and 3b from a control signal input terminal 6. The output of inverter 1a is connected from the node 2b to the gates of the FETs 1c and 1d. The node 2b is connected to a data output terminal 7.

The FETs 1c, 1d and 3b forms a feedback circuit which receives its data input from the node 2b and its control input from the control signal input terminal 6.

The feedback circuit feeds its output to the node 2a. The FET 3b is a switching element (second switching means) interposed between the node 2a and ground potential in series with the FET 1d.

Referring to FIG. 5, explanation will be given of the operation when the logic circuit apparatus changes its state from a "0" holding state to a "1" holding state.

When the control signal "1" is applied to the FETs 3a and 3b from the control signal input terminal 6, the FET 3a becomes conductive, FET 3b becomes non-conductive, and the data input terminal 5 is connected electrically with the node 2a. The node 2a is disconnected electrically from the output of the FET 1d by FET 3b.

Initially, the value held at the node 2a is "0". When the value of input data from the data input terminal 5 is "1", and the control signal "1" is applied to FET 3a, the electric potential of the node 2a rises. Since the FET 3a is N-type, the electric potential of the node 2a can rise to a value lower than the source potential by the threshold voltage Vth of FET 3a until the logical threshold of inverter 1a is reached. The rise of electric potential is permitted because the off condition of FET 3b prevents grounding of node 2a through FET 1d. In addition, since the rise in electric potential at node 2a is not prevented, the rising speed of electric potential at the node 2a is improved.

And when electric potential at the node 2a exceeds the logical threshold of the inverter 1a, the output of inverter 1a turns on the FET 1c. The electric potential at the node 2a rises further to the source potential, thereby DC feed-through current is prevented from flowing through the inverter 1a.

When the control signal at control terminal 6 changes from "1" to "0", the FET 3a becomes non-conductive, FET 3b becomes conductive, thereby the nodes 2a and 2b respectively hold the values existing immediately before the change of the control signal. The data output terminal 7 continues to output the value held at the node 2b until the FET 3a again becomes conductive.

Next, an explanation will be given on the operation when the logic circuit apparatus change its state from a "1" holding state to a "0" holding state.

Initially, the value of the node 2b is "0", the FET 1c of the feedback circuit is on. Therefore, when a "1" is applied to control input 6 and a "0" is applied in the data input terminal 5, the electric potential of the node 2a drops to a value which is determined by the ratio of the on-resistance of the FET 3a to the on-resistance of the FET 1c. Since the FET 3a is an N-type, the electric potential can be reduced to a value close to 0V where the on-resistance of the FET 1c smaller, thereby the inverter 1a surely can be driven. Accordingly, in the feedback circuit shown in FIG. 5, there is no necessity to provide a switch element in series with FET 1c between the node 2a and the source potential.

Figure 6:
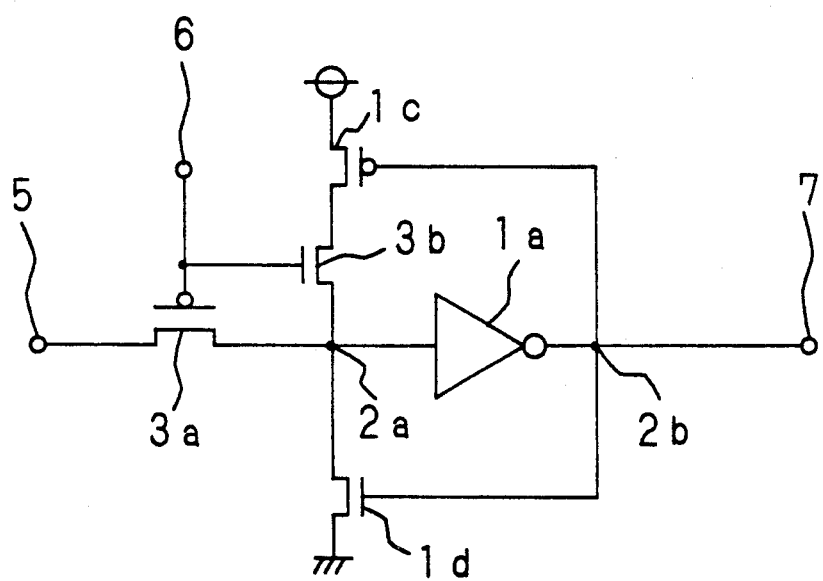
FIG. 6 is a circuit diagram showing a semiconductor logic circuit apparatus according to a second embodiment of the invention.

In addition, in the above-mentioned embodiment, the conductive type of transistors of the FETs 3a and 3b are respectively N-type and P-type. However, the same effect can be obtained by interposing the FET 3b in series with the FET 1c between the source potential and the node 2a after changing the conductive type of the FET 3a to a P-type and that of the FET 3b to an N-type as shown in FIG. 6. The control signal at control terminal 6 is inverted from the embodiment shown in FIG. 5.

Figure 7:
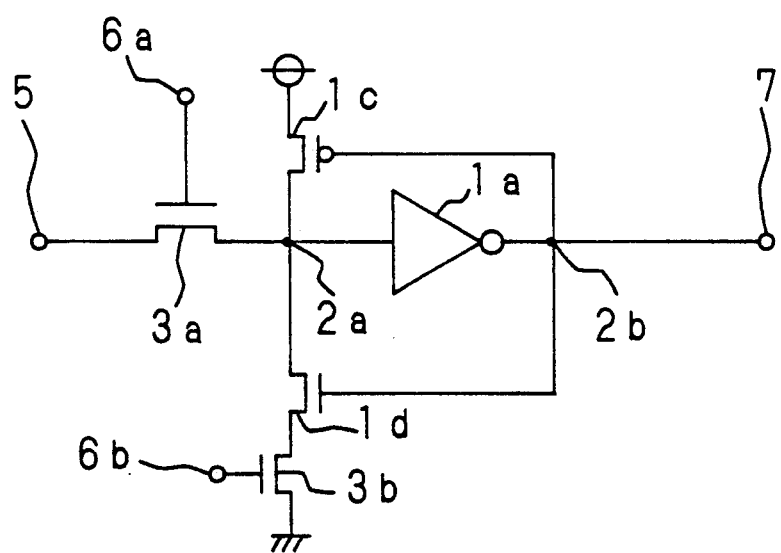
FIG. 7 is a circuit diagram showing a semiconductor logic circuit apparatus according to a third embodiment of the invention.
Figure 8:
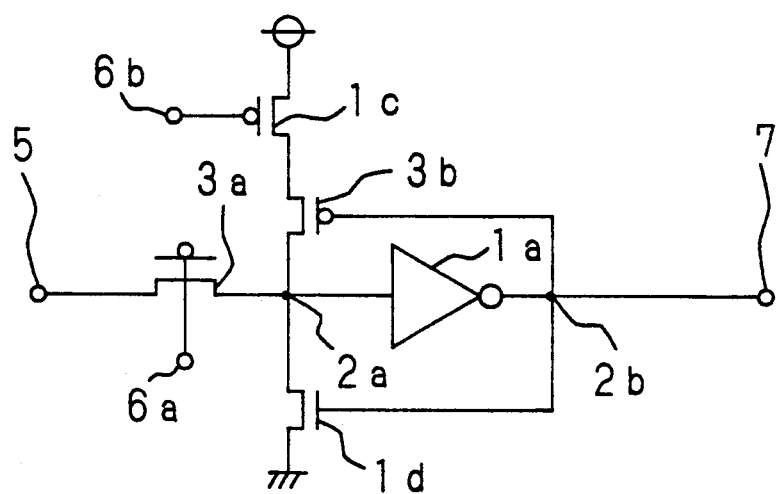
FIG. 8 is a circuit diagram showing a semiconductor logic circuit apparatus according to a fourth embodiment of the invention.

In the embodiment shown in FIG. 5, the conductive type of transistors of the FETs 3a and 3b are respectively N-type and P-type, however, the same effect can be obtained by making the FET 3b N-type as shown in FIG. 7 and by making the control signal the complement of the control signal for connection to the FET 3a and FET 3b.

Furthermore, in the embodiment shown in FIG. 6, the conductive type of the FETs 3a and 3b are respectively P-type and N-type, however, the same effect can be achieved by making the conductive type of the FET 3b P-type and applying a control signal to FET 3b which is complementary to the one applied to the FET 3a.

Figure 9:
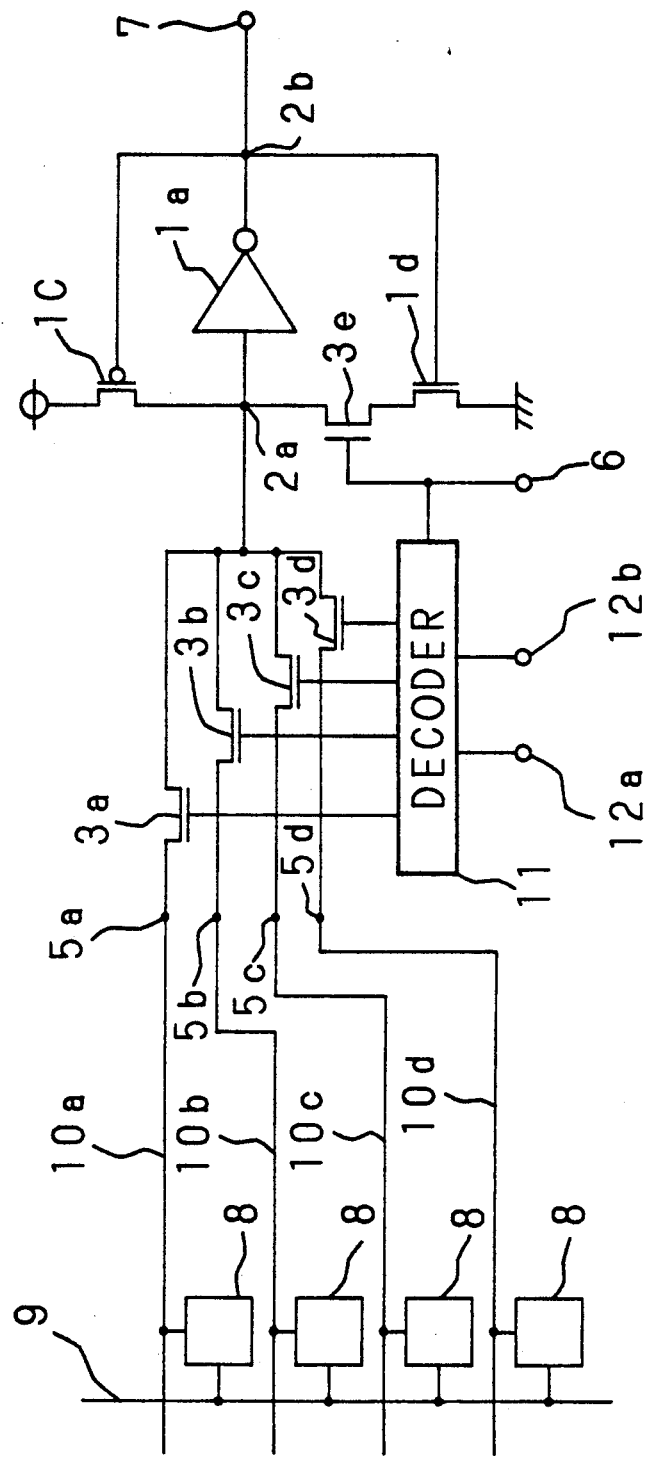
FIG. 9 is a circuit diagram showing a semiconductor logic circuit apparatus of the invention in use as a sense latch circuit of single-bit line.

Next, FIG. 9 shows a circuit diagram applying the semiconductor logic circuit apparatus of the invention to a sense latch circuit of a signal-bit line.

In FIG. 9, a plurality of memory cells 8 are connected to a word line 9 and single bit lines 10a through 10d. Data input terminals 5a through 5d are respectively connected to single bit lines 10a through 10d. Ends of FETs 3a through 3d are commonly connected to a node 2a. The other ends of FETs 3a through 3d are respectively connected to the data input terminals 5a through 5d. Outputs of a decoder 11 are connected to gates of the FETs 3a through 3d as control signal. The decoder 11 outputs a group of control signals corresponding to address input signals 12a through 12b. At that time, the control signal connected to the FET 3e from the control signal input terminal 6 also serves a control signal for the decoder 11. When the control signal is input, the FET 3e become non-conductive. The decoder 11 outputs a single control signal which makes only one of FETs 3a through 3d conductive. All of the remainder of the FETs remain non-conductive. Thereby, data from a single one of memory cells 8 is connected to the node 2a as data input. When the control signal makes the FET 3e conductive, the decoder 11 outputs a control signal which makes all of the FETs 3a through 3d non-conductive. As a result, the nodes 2a and 2b hold their respective data.

Figure 10:
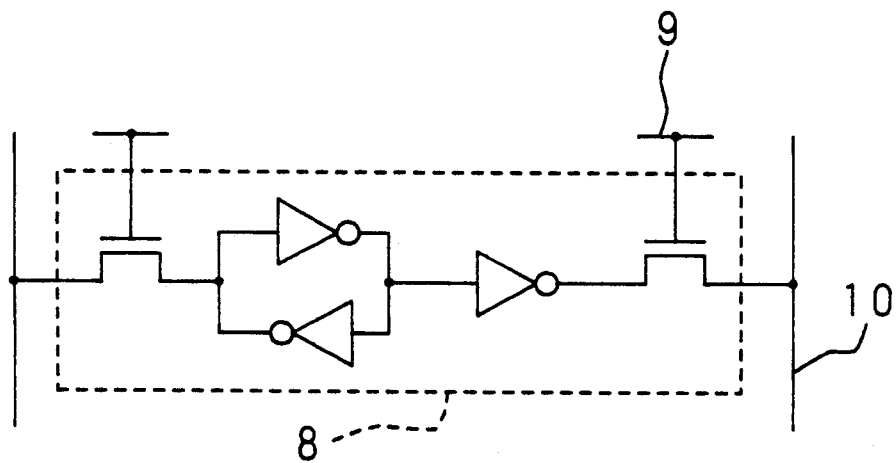
FIG. 10 is a circuit diagram showing a memory cell of the semiconductor logic circuit apparatus.

In addition, FIG. 10 is a circuit diagram showing a FIFO circuit as an example of the memory cell 8, however, a ROM, a multiport memory, or the like can be used instead of the memory cell 8.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A semiconductor logic circuit apparatus for holding data, comprising:
   first switching means, which includes a plurality of conductive type field effect transistors whose one ends are commonly connected, for changing said holding data;
   an inverter circuit, receiving an input from commonly connected one ends of said first switching means and producing an output;
   a feedback circuit, disposed between a first potential and a second potential;
   an input node of said feedback circuit being connected to an output node of said inverter circuit;
   an output node of said feedback circuit being connected to an input node of said inverter circuit;
   means for supplying a data input to said first switching means; and
   second switching means, coupled between an output of said feedback circuit and one of said first potential and said second potential; and
   said second switching means being responsive to a second control signal such that said feedback circuit is enabled when all of said first switching means are non-conductive in response to a first control signal, and such that said feedback circuit is disabled when any one of said first switching means is conductive.

2. A semiconductor logic circuit apparatus for holding data, comprising:
   a plurality of input nodes each receiving an input data;
   a control signal generating means for generating a plurality of first control signals;
   a plurality of first switching transistors each having a first main electrode, a second main electrode, and a control terminal;
   said first main electrode being connected to a respective one of said input nodes;
   said second main electrode being connected to a common node; and
   said control electrode receiving the corresponding first control signal;
   an inverter circuit having an input node connected to said common node, and an output node for outputting an output data;
   a feedback circuit having a P-channel type transistor and an N-channel type transistor;
   said P-channel type transistor being connected between a supply potential node and said common node;
   said N-channel type transistor being connected between a ground potential node and said common node; and
   control electrodes of said P-channel and N-channel type transistors being connected to the output node of said inverter circuit;

a second switching transistor connected in series with said P-channel and N-channel type transistors; and said second switching transistor being responsive to a second control signal such that said second switching transistor is conductive when all of said first switching transistors are non-conductive and such that said second switching transistor is non-conductive when one of said first switching transistor is conductive.

3. A semiconductor logic circuit apparatus according to claim 2 comprising a control signal generating means responsive to said second control signal for generating said first control signals such that all of said first switching transistors are non-conductive when said second switching transistor is conductive.

* * * * *